United States Patent [19]
Paranjpe

[11] Patent Number: 5,882,991
[45] Date of Patent: Mar. 16, 1999

[54] APPROACHES FOR SHALLOW JUNCTION FORMATION

[75] Inventor: Ajit Pramond Paranjpe, Sunnyvale, Calif.

[73] Assignee: Texas Instruments Incorporated, Dallas, Tex.

[21] Appl. No.: 710,599

[22] Filed: Sep. 20, 1996

Related U.S. Application Data

[60] Provisional application No. 60/004,543 Sep. 29, 1995.

[51] Int. Cl.$^6$ .............................. H01L 21/22; H01L 21/38
[52] U.S. Cl. ............................................................. 438/565
[58] Field of Search .................................... 437/165, 950; 438/565, 566, 567, 568, 569

[56] References Cited

U.S. PATENT DOCUMENTS

| | | | |
|---|---|---|---|
| 5,387,545 | 2/1995 | Kiyota et al. | 437/165 |
| 5,514,620 | 5/1996 | Aoki et al. | 437/950 |
| 5,565,377 | 10/1996 | Weiner et al. | 437/173 |

OTHER PUBLICATIONS

1997 IEEE, 0–7803–3289–X/97 (pp. 760–763); "Application of a Pulsed, RF–Driven, Multicusp Source for Low Energy Plasma Immersion Ion Implantation." (A.B. Wengrow, K.N. Leung, L.T. Perkins, D.S. Pickard, M.L. Rickard, M.D. Williams and M. Tucker). No month.

1996 Materials Science Engineering, R17 (207–280); "Plasma Immersion Ion Implantation—a Fledgling Technique for Semiconductor Processing." (Paul K. Chu, Shu Qin, Chung Chan, Nathan W. Cheung and Lawrence A. Larson). No month.

1997 Electrochemical Society Meeting, Fourth Int'l Symposium on Silicon Nitride and Silicon Dioxide Thin Insulating Films; "Using Trimethylsilane to Improve Saftey, Throughput and Versaltility in PECVD Processes." (M.J. Loboda, J.A. Seifferly, C.M. Grove and R.F. Schneider, Dow Corning Corporation.). No month.

1996 Proc. Fall MRS Symposium; "Safe Precursor Gas for Broad Replacement of SiH4 in Plasma Processes Employed in Integrated Circuit Production." (M.J. Loboda, J.A. Seifferly, C.M. Grove and R.F. Schneider, Dow Corning Corporation.). No month.

IEEE Electron Device Letters, vol. 15, No. 6, Jun. 1994 (pp. 196–198); "Trench Doping Conformality by Plasma Immersion Ion Implantation (PIII)." (Crid Yu and Nathan W. Cheung.).

IEEE Electron Device Letters, vol. 17, No. 10, Oct. 1996 (pp. 461–463); "Characterization of Reverse Leakage Components for Ultrashallow p+/n Diodes Fabricated Using Gas Immersion Ion Implantation." (K. Josef Krammer, Somit Talwar, Anthony M. McCarthy and Kurt H. Weiner.).

IEEE Transactions on Electron Devices, vol. ED–32, No. 11, Nov. 1985; pp. 2532–2533.

IEEE Electron Device Letters, vol. EDL–7, No. 7, Jul. 1986 (pp. 440–442); "Fabrication of Submicrometer MOSFET's Using Gas Immersion Laser Doping (GILD)." (P.G. Carey, K. Bezjian, Thomas W. Sigmon, P. Gildea and T.J. Magee.).

IEEE Transactions on Computer–Aided Design, vol. 7, No. 2, Feb. 1988 (pp. 205–214); "Numerical Simulation of the Gas Immersion Laser Doping (GILD) Process in Silicon." (Ettore Landi, Paul G. Carey and Thomas W. Sigmon.).

(List continued on next page.)

*Primary Examiner*—Brian Dutton
*Attorney, Agent, or Firm*—Jacqueline J. Garner; W. James Brady, III; Richard L. Donaldson

[57] ABSTRACT

A method for forming shallow junctions using rapid thermal gas-phase doping (RTGPD). A wafer (26) is placed in a process chamber (14). After evacuating the chamber, a dopant gas combined with a carrier gas is introduced to the chamber (14) while the pressure is increased from a base pressure to on the order of 200–3000 Torr. The gas flow is shut off when the desired elevated pressure is reached. A rapid thermal cycle is then performed using a static gas flow and elevated pressures to create a shallow junction (40).

13 Claims, 2 Drawing Sheets

OTHER PUBLICATIONS

IEEE Electron Device Letters, vol. 10, No. 6, Jun. 1989 (pp. 260–263); "Thin–Base Bipolar Transistor Fabrication Using Gas Immersion Laser Doping." (K.H. Weiner and Thomas W. Sigmon).

IEEE Transactions on Electron Devices, vol. 35, No. 12, Dec. 1988 (p. 2429).

IEEE Transactions on Electron Devices, vol. 39, No. 10, Oct. 1992 (pp. 2354–2358); "Plasma Immersion Ion Implantation Doping Using a Microwave Multipolar Bucket Plasma." (Shu Qin, Nicol E. McGruer, Chung Chan and Keith Warner).

IEEE Electron Device Letters, vol. 9, No. 10, Oct. 1988 (pp. 542–544); "A Shallow Junction Submicrometer PMOS Process Without High–Temperature Anneals." (P.G. Carey, K.H. Weiner and Thomas W. Sigmon).

IEEE Electron Device Letters, vol. 13, No. 7, Jul. 1992 (pp. 369–446); "Low Temperature Fabrication of $p^+$–n Diodes With 300–Å Junction Depth." (Kurt H. Weiner, Paul G. Carey, Anthony M. McCarthy and T.W. Sigmon).

IEEE Electron Device Letters, vol. 14, No. 9, Sep. 1993 (pp. 444–446); "Characteristics of Sub–100–nm $p^+/n$ Junctions Fabricated by Plasma Immersion Ion Implantation." (Erin C. Jones and Nathan W. Cheung).

1994 J. Vac. Sci. Technol. B 13(5), Sep./Oct. 1995 (pp. 1994–1998); "Charging Effects in Plasma Immersion Ion Implantation for Microelectronics." (Shu Qin, James D. Bernstein, Zhuofan Zhao, Wei Liu, Chung Chan, Jiqun Shao and Stuart Denholm).

J. Vac. Sci. Technol. B 12(2), Mar./Apr. 1994 (pp. 973–976); "Plasma Immersion Ion Implantation for Semiconductor Thin Film Growth." (M. Tuszewski, J.T. Scheuer, I.H. Campbell and B.K. Laurich).

Nuclear Instruments and Methods in Physics Research B 121 (1997) (pp. 226–230); "Plasma Immersion Ion Implantation for Materials Modification and Semiconductor Processing: Carbon Nitride Films and Poly–Si TFTs Hydrogenation." (Imad F. Husein, Shu Qin, Yuan–Zhong Zhou and Chung Chan). No month.

Nuclear Instruments and Methods in Physics Research B 106 (1995) (pp. 636–640); "An Investigation of Dopant Gases in Plasma Immersion Ion Implantation." (Shu Qin, James D. Bernstein, Zhuofan Zhao, Chung Chan, Jiqun Shao and Stuart Denholm). No month.

Solid State Technology, May 1992 (pp. 81–84); "Plasma Immersion Ion Implantation: A Cluster Compatible Technology." (Carey Pico).

Mat. Res. Soc. Symp. Proc. vol. 223, 1991 Material Research Society (pp. 377–383); "Selective Copper Plating In Silicon Dioxide Trenches With Metal Plasma Immersion Ion Implantation." (Meng–Hsiung Kiang, Carey A. Pico, Michael A. Lieberman and Nathan W. Cheung). No month.

Appl. Phys. Lett. 53 (22), 28 Nov. 1988, 1988 American Institute of Physics (pp. 2143–2145); "Plasma Immersion Ion Implantation Using Plasmas Generated by Radio Frequency Techniques." (J. Tendys and I.J. Donnelly, M.J. Kenny and J.T.A. Pollock).

J. Electrochem. Soc., vol. 141, No. 5, May 1994 (pp. 1378–1381); "Shallow n+Junctions in Silicon by Arsenic Gas–Phase Doping." (C.M. Ransom, T.N. Jackson, J.F. DeGelormo, C. Zeller, D.E. Kotecki, C. Graimann, D.K. Sadana and J. Benedict).

J. Vac. Sci. Technol. B 12(3), May/Jun. 1994 (pp. 1390–1393); "Arsenic Gas–Phase Doping of Polysilicon." (C.M. Ransom, T.N. Jackson, J.F. DeGelormo, D. Kotecki, C. Graimann and D.K. Sadana).

SPIE vol. 476, Excimer Lasers, Their Applications, and New Frontiers in Lasers (1984) (pp. 92–101); "Gas Immersion Laser Doping." (R.J. Pressley, T.W. Sigmon and T.S. Fahlen). No month.

SPIE vol. 1804, Rapid Thermal and Laser Processing (1992) (pp. 87–93); "Doping of and Outdiffusion from Tungsten Silicide Films Using Gas Immersion Laser Doping." (Emi–Ishida, Karl J. Krammer, Thomas Sigmon and Kurt H. Weiner). No month.

IEEE Conference Record–Abstracts, 1996 IEEE International Conference on Plasma Science, Boston, Mass., Jun. 3–5, 1996 (pp. 96–97); "Study of High Efficient Plasma Immersion Ion Implantation Hydrogenation for CMOS Poly–Si TFT's Using an ICP Plasma Source." (Shu Qin, Yuanzhong Zhou and Chung Chan). No month.

IBM Technical Disclosure Bulletin, vol. 17, No. 8, Jan. 1975 (pp. 2322–2323); Gas Phase Doping of Semiconductors During Float–Zone Crystal Growth. (T.F. Ciszek).

Mateirals Research Society Symposia Proceedings, vol. 23, Nov. 1983, Boston, Mass. (pp. 247–253); "Energy Beam—Solid Interactions and Transient Thermal Processing." (John C. C. Fan, Noble M. Johnson).

"A Resistless, Nanosecond Thermal Doping/Diffusion Technology." (Kurt H. Weiner, Lawrence Livermore National Laboratory, Livermore, CA). No date.

"Plasma Immersion Ion Implantation for ULSI Devices." (Nathan W. Cheung, University of California, Berkeley, CA). No date.

Mat. Res. Soc. Symp. Proc. vol. 263, 1992 Material Research Society (pp. 383–388); "Dopant Distribution and Electrical Characteristics of Boron–Doped $Si_{1-y}Ge_y/Si$ $p^+/N$ Heterojunction Diodes Produced by Gas Immersion Laser Doping (GILD)/Pulsed Laser–Induced Epitaxy (PLIE)." K. Josef Kramer, E. Ishida, S. Talwar, K.H. Weiner, P.G. Carey, A.M. McCarthy and T.W. Sigmon.

SPIE vol. 1041, Metal Vapor, Deep Blue, and Ultraviolet Lasers (1989) (pp. 214–218); "Bipolar Transistor Fabrication Using Gas Immersion Laser Doping." (Kurt H. Weiner and Thomas W. Sigmon). No month.

Mat. Res. Soc. Symp. Proc. vol. 260, 1992 Materials Research Society (pp. 673–678); "Shallow Junction Formation in Silicon: Dopant Incorporation and Diffusion Through Tungsten Silicide Films Using Gas Immersion Laser Doping (GILD)." (Emi Ishida, K. Josepf Kramer, Somit Talwar, Thomas W. Sigmon, Kurt H. Weiner and William T. Lynch). No month.

1988 American Institute of Physics, 0887–3518/87/090661–05 (pp. 661–665); "Si–Photocell With an Ultrashallow Junction by Gas Immersion Laser Doping and Its Characteristics." (Zhou Zhengzhuo, Li Ding, Qiu Mingxin and Zhou Yaliang). No month.

1996 IEEE Int'l Conference, Jun. 3–5, 1996, Boston, Mass. (pp. 94–97); "Current Closure for the Electrodynamic Tether." (W.C. Leung and Nagendra Singh).

Nuclear Instruments and Methods in Physics Research A 377 (1996) (pp. xiii–xvi); "Back–Illuminated CCDs Made by Gas Immersion Laser Doping." (M.L. Van Den Berg, A.J.F. Den. Boggende, T.M.V. Bootsma, J.W. Den Herder, F.A. Jansen, P.A.J. De Korte, E.J. Van Zwet, T. Eaton and R. Ginige). No month.

SPIE vol. 2091 (pp. 63–70); "Fabrication of Sub–40–nm p–n Junctions for 0.18 $\mu$m MOS Device Applications Using a Cluster–Tool–Compatible, Nanosecond Thermal Doping Technique." (Kurt H. Weiner and Anthony M. McCarthy). No date.

APPROACHES FOR SHALLOW JUNCTION FORMATION

This application claims priority under 35 USC § 119 (e)(1) of provisional application number 60/004,543, filed 09/29/95 and now abandoned.

FIELD OF THE INVENTION

This invention generally relates to semiconductor processing and more specifically to shallow junction formation.

BACKGROUND OF THE INVENTION

A significant requirement in sub-half-micron high-performance semiconductor technologies is junction depth reduction in, for example, CMOS (complementary metal-oxide-semiconductor) source and drains and bipolar emitters and bases. Reducing the junction depth suppresses MOS (metal-oxide-semiconductor) transistor punchthrough leakage and minimizes short channel effects such as drain-induced barrier lowering (DIBL) in CMOS devices. Devices junctions with relatively high dopant concentrations, ultra-shallow depths (e.g., below 1000 Å), low contact sheet resistances, and low junction leakage currents will be critical for advanced subquarter-micron technologies.

Rapid thermal gas phase doping (RTGPD) is one advanced manufacturing doping technique for low defect density ultra-shallow junction formation for 0.25 $\mu$m and sub-0.25 $\mu$m ULSI (ultra-large scale integration) semiconductor technologies. This doping method provides a wide range of surface concentrations and junction depths on both planar and high-aspect ratio trench surfaces. In addition, this doping method is compatible with advanced submicron IC (integrated circuit) process flows while offering reliable, high throughput, and low cost options for high quality ultra-shallow junction formation.

RTGPD involves a three step process based on surface chemical adsorption of dopant gas molecules. First, the native oxide of the silicon surface is removed. Then, an adsorbed dopant layer is formed on the silicon surface. Finally, solid phase diffusion of dopants from the adsorbed layer into the silicon substrate is accomplished. Dopants are incorporated into the silicon substrate by diffusion in an oxygen-free atmosphere at a relatively low temperature. This process differs from conventional diffusion in which dopant diffusion is performed in an oxygen-rich ambient. Ultra-shallow junctions (e.g., junction depths of 700 Å) with excellent electrical characteristics (e.g., leakage current less than $2 \times 10^{-16}$ A/$\mu$m$^2$) have been achieved. In an effort to deal with uniformity problems both inter-wafer and intra-wafer, complicated gas distribution systems have been developed. However, these problems with uniformity have not been satisfactorily solved. Accordingly, there is a need for a RTGPD system that improves dopant uniformity both interwafer and intra-wafer.

TECHNICAL ADVANTAGES OF THE INVENTION

An advantage of the invention is providing a RTGPD system that produces a uniform dopant distribution across a wafer.

A further advantage of the invention is providing a RTGPD system that reduces dopant consumption over prior art systems.

A further advantage of the invention is providing a RTGPD system having a simplified gas flow system that eliminates the need for complicated gas showerhead assemblies.

A further advantage of the invention is providing a RTGPD system having improved wafer to wafer repeatability due to the fact that dopant concentration in the gas phase is high enough for saturating the wafer surface at its solid solubility level.

These and other advantages will be apparent to those of ordinary skill in the art having reference to the specification in conjunction with the drawings and claims.

DETAILED DESCRIPTION OF PREFERRED EMBODIMENTS

The invention is directed to approaches for forming shallow junction regions such as those used in sub-micron high-performance semiconductor technologies. The benefits of the invention may be utilized in devices desiring shallow junction regions such as CMOS source and drain regions and bipolar base and emitter regions.

One embodiment of the invention will now be described in conjunction with RTGPD. Conventional RTGPD processes use moderate pressures and continuous dopant gas flow. However, a continuous dopant gas flow can result in dopant concentration gradients across the wafer and thus, non-uniform doping. In addition, a large fraction of dopant gases are not used and flow into the exhaust. In contrast, the first embodiment of the invention uses a static gas flow and elevated pressures. Because the dopant gas is not flowing during the thermal cycle, dopant concentration is uniform across the wafer and uniform doping occurs. Elevated pressures ensure that dopant concentration on the wafer surface reaches solid solubility levels.

Figure 1:
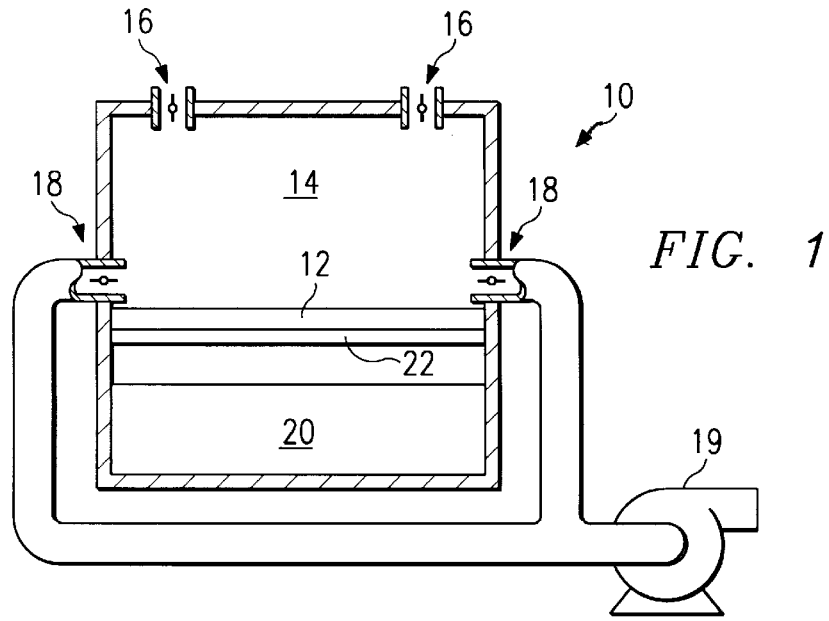
FIG. 1 is a block diagram of a RTP system.

A conventional RTP system may be used to practice the invention. However, the RTP system is modified to allow for static gas flow. As a result, the complicated showerhead assemblies of prior art systems may be eliminated and replaced with a simpler gas flow system, if desired. Such a system 10 is shown in FIG. 1. A chuck 12 for holding a wafer to be processed is located within chamber 14. Inlet ports 16 are used to supply process gases to chamber 14. The number of inlet ports 16 may vary. A single inlet port 16 may be used. Pump out ports 18 are used for exhaust and in conjunction with pump 19 for controlling the pressure within chamber 14. Temperature within the chamber 14 is controlled by lamps 20 opposite quartz window 22 from chuck 12.

Figure 2:
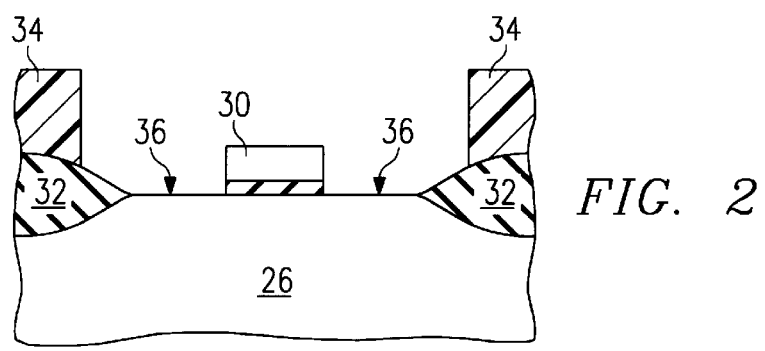
FIG. 2 is a cross-sectional diagram of a wafer to be processed in the RTP system of FIG. 1.

A wafer 26 for which shallow junctions are desired is placed in chamber 14. Presumably, wafer 26 is already partially processed. For example, if shallow junctions are required for CMOS source and drain regions, the wafer 26 is processed through gate electrode formation. A wafer 26 processed through gate electrode 30 formation is shown in FIG. 2 and includes field oxide areas 32 to isolate devices. A masking layer 34 is used to masks areas of wafer 26 where dopant is not desired and to expose semiconductor areas 36 where shallow junctions are desired. Using the CMOS example above, areas of the wafer where p-type devices are desired may be masked while forming the n-type source and drain regions. The process described herein may then be repeated with a p-type dopant for the p-type devices while masking the n-type devices.

Figure 3:
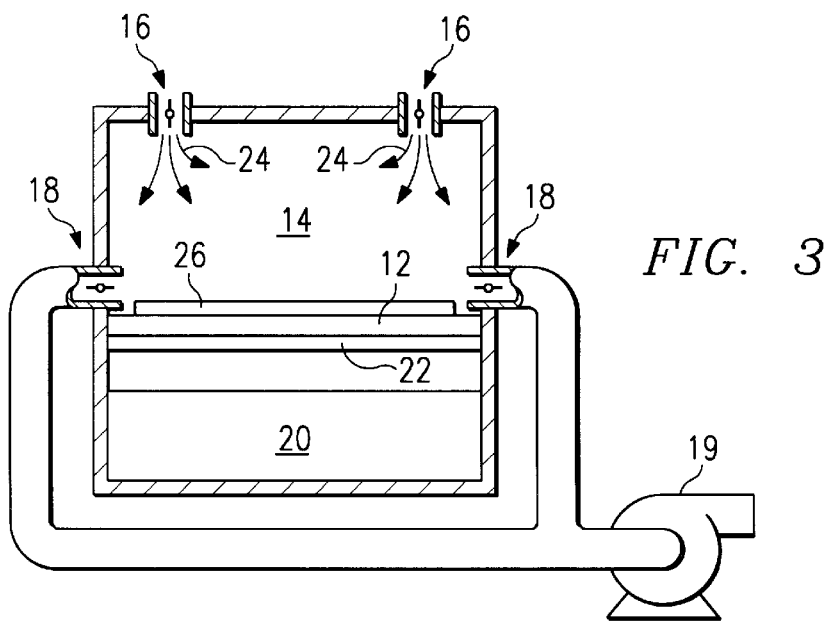
FIGS. 3–4 are block diagrams of the wafer of FIG. 2 in the RTP system of FIG. 1 during processing.

After placing the wafer 26 in chamber 14, chamber 14 is exhausted and pumped down to a base pressure. The base pressure is typically in the range of 1E $10^{-6}$ Torr. A dopant gas in conjunction with a diluent carrier gas (collectively indicated by arrows 24) is supplied through inlet ports 16 into chamber 14, as shown in FIG. 3. Typical dopant gases include phosphine, arsine, and diborane. Other suitable dopant gases will be apparent to those skilled in the art. Typical diluent gases include hydrogen, argon, and nitrogen. Of course, other suitable gases will be apparent to those skilled in the art. While the dopant and diluent carrier gases are being supplied, the pressure in chamber 14 is increased to a process pressure in the range of 200–3000 Torr. Pressure should be adjusted to achieve the desired surface concentration of dopant on the wafer. Doping rate and junction depth are also set by the surface concentration.

Once the process pressure has been reached, the dopant and diluent carrier gases flow is shut off. The resultant dopant mole fraction in the gas phase within chamber 14 must far exceed that required to achieve the solid solubility limit of the dopant at the wafer surface at the RTGPD temperature. For example, the partial pressure of diborane in the gas phase must far exceed 2) $\times 10^{-2}$ Torr for a RTGPD temperature of 1100° C. Typically, one order of magnitude exceed in partial pressure is sufficient. Continuous gas flow is not required because the amount of dopant actually needed to be diffused into the wafer is significantly less than the amount of dopant capable of being present within the chamber in the gas phase under those elevated partial pressure conditions. Accordingly, one advantage of the invention is that a lower amount of dopant gas is exhausted/wasted. By achieving the solid solubility limit of dopant at the wafer surface, an adsorbed layer of dopant exists on the wafer surface and is ready to be diffused into the wafer.

Figure 4:
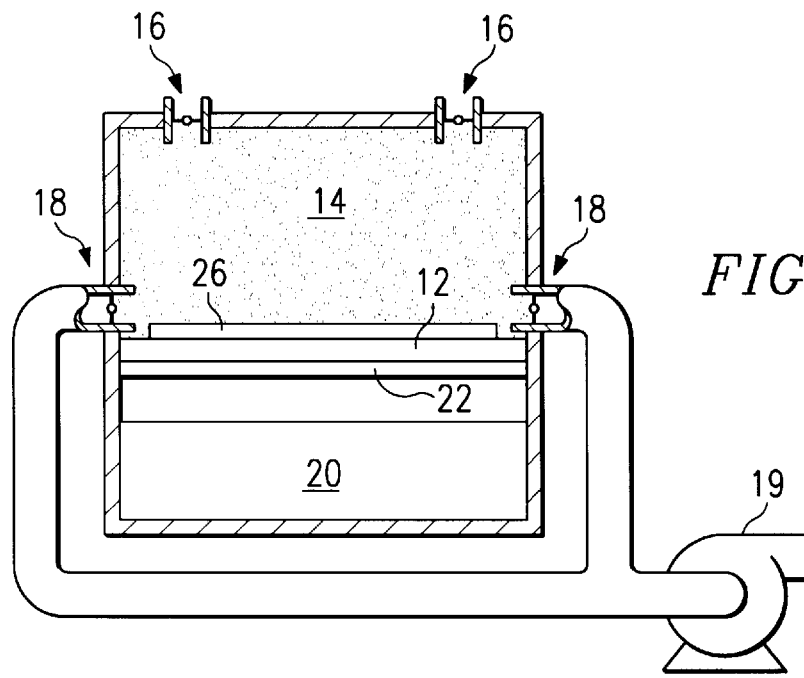
Figure 5:
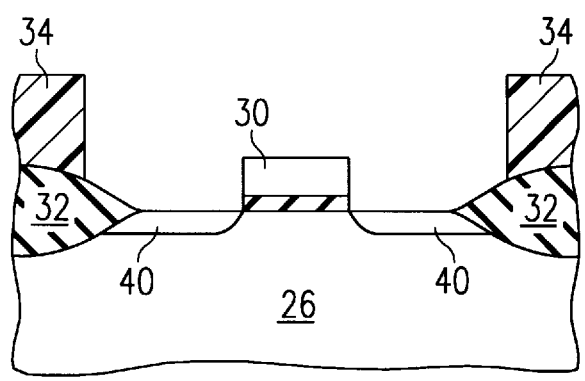
FIG. 5 is a cross-sectional diagram of a wafer including shallow junction region formed according to the invention.

After the chamber pressure has equilibrated, the wafer is subjected to the desired RTP cycle. Allowing the pressure to equilibrated ensures a uniform dopant concentration within chamber 14, as shown in FIG. 4. Accordingly, uniform doping may be achieved during the RTP cycle. A RTGPD temperature in the range of 800°–1100° C. is desired for a duration in the range of 1–5 min. During the RTP cycle, dopant accumulates at the surface of the wafer and diffuses into the wafer at exposed semiconductor areas to form shallow junction regions 40, as shown in FIG. 5. The depth of shallow junction regions 40 is determined by the temperature and duration of the RTP cycle. Typically depth may be on the order of 0.05–0.15 microns.

After the RTP cycle, the temperature is ramped back down to 400°–600° C. The chamber 14 is then evacuated. A purge gas may alternatively or additionally be used to flush the excess unused dopant from the chamber 12 including dopants in the gas phase, on the wafer surface and on the chamber walls. The wafer is then removed from the chamber 14 and is ready for further processing. Although illustrated as forming source and drain regions after gate electrode formation, this is merely an example. The invention is equally applicable to other steps in the process and other processes where shallow junction regions are desired.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for forming a shallow junction region in a substrate, comprising the steps of:

loading said substrate in a chamber;

pumping said chamber to a base pressure;

flowing at least one dopant gas in said chamber;

increasing the pressure in said chamber to an elevated pressure during said step of flowing said dopant gas, said elevated pressure comprising a pressure in the range of 200–3000 Torr;

terminating said flowing said dopant gas step when the pressure in said chamber reaches said elevated pressure; and performing a rapid thermal gas-phase doping cycle to diffuse dopant from said dopant gas into said substrate after said terminating step.

2. The method of claim 1, wherein said step of flowing a dopant gas further comprises the step of flowing a carrier gas.

3. The method of claim 1, wherein said base pressure comprises a pressure in the range of $10^{-8}$ –$10^{-3}$ Torr.

4. The method of claim 1 further comprising the step of equilibrating said elevated pressure through said chamber prior to said step of performing said rapid thermal gas-phase doping cycle.

5. The method of claim 1 further comprising the step of evacuating said chamber prior to said pressurizing step and after said performing a rapid thermal gas-phase doping cycle step.

6. The method of claim 1, further comprising the steps of:

reducing the temperature of said substrate after said rapid thermal gas-phase doping step;

evacuating said chamber; and purging said chamber to remove dopant from said chamber including dopant on a surface of said substrate and on a wall of said chamber.

7. The method of claim 1, wherein said step of performing said rapid thermal gas-phase doping cycle comprises the steps of:

increasing the temperature of said substrate to a temperature in the range of 800°–1200° C.;

maintaining said temperature in said substrate for a duration in the range of 1–5 min; and reducing said temperature of said substrate to a temperature on the order of 400°–600° C.

8. The method of claim 1, wherein said flowing step provides a dopant mole fraction in the gas phase at least an order of magnitude greater than that required to achieve the solid solubility limit of the dopant at the wafer temperature during said step of performing said rapid thermal gas-phase doping cycle.

9. A method of forming a shallow junction region in an area of a partially processed wafer comprising the steps of:

loading said wafer in a rapid thermal processing (RTP) chamber;

evacuating said RTP chamber;

pressurizing said RTP chamber to a base pressure;

flowing a dopant gas diluted with a carrier gas into said RTP chamber;

increasing the pressure in said RTP chamber to an elevated pressure during said step of flowing said dopant gas, said elevated pressure comprising a pressure in the range of 200–3000 Torr;

terminating said flowing said dopant gas step when the pressure in said RTP chamber reaches said elevated pressure; and performing a rapid thermal gas-phase doping cycle to diffuse dopant from said dopant gas into said area of said wafer after said terminating step and after the pressure in said RTP chamber has equilibrated.

10. The method of claim 9, wherein said base pressure comprises a pressure in the range of $10^{-8}$–$10^{-3}$ Torr.

11. The method of claim 9, further comprising the steps of:

reducing the temperature of said substrate after said rapid thermal gas-phase doping step;

evacuating said chamber; and purging said chamber to remove dopant from said chamber including dopant on a surface of said substrate and on a wall of said chamber.

12. The method of claim 9, wherein said step of performing said rapid thermal gas-phase doping cycle comprises the steps of:

increasing the temperature of said substrate to a temperature in the range of 800°–1200° C.;

maintaining said temperature in said chamber for a duration in the range of 1–5 min; and reducing said temperature of said substrate to a temperature on the order of 400°–600° C.

13. The method of claim 9, wherein said flowing step provides a dopant mole fraction in the gas phase at least an order of magnitude greater than that required to achieve the solid solubility limit of the dopant at the wafer temperature during said step of performing said rapid thermal gas-phase doping cycle.

\* \* \* \* \*